US012696815B2

(12) United States Patent
Chang

(10) Patent No.: US 12,696,815 B2
(45) Date of Patent: Jul. 28, 2026

(54) SEMICONDUCTOR PACKAGE AND A METHOD OF MANUFACTURING THE SAME

(71) Applicant: Samsung Electronics Co., Ltd., Suwon-si (KR)

(72) Inventor: Gunho Chang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 370 days.

(21) Appl. No.: 18/469,946

(22) Filed: Sep. 19, 2023

(65) Prior Publication Data

US 2024/0304599 A1     Sep. 12, 2024

(30) Foreign Application Priority Data

Mar. 9, 2023     (KR) ........................ 10-2023-0031353

(51) Int. Cl.
| | |
|---|---|
| *H10W 90/00* | (2026.01) |
| *H10D 62/10* | (2025.01) |
| *H10P 54/00* | (2026.01) |
| *H10W 74/01* | (2026.01) |
| *H10W 74/10* | (2026.01) |
| *H10W 80/00* | (2026.01) |

(52) U.S. Cl.
CPC .......... *H10W 90/00* (2026.01); *H10D 62/117* (2025.01); *H10P 54/00* (2026.01); *H10W 74/01* (2026.01); *H10W 74/131* (2026.01); *H10W 80/312* (2026.01); *H10W 80/327* (2026.01); *H10W 90/792* (2026.01)

(58) Field of Classification Search
CPC ... H10W 90/00; H10W 90/792; H10W 72/90; H10W 80/312; H10W 90/24

USPC .......................................................... 257/777
See application file for complete search history.

(56) References Cited

U.S. PATENT DOCUMENTS

| | | | |
|---|---|---|---|
| 8,049,327 | B2 | 11/2011 | Kuo et al. |
| 10,692,966 | B2 | 6/2020 | Yen et al. |
| 10,867,857 | B2 | 12/2020 | Jeon et al. |
| 10,872,775 | B2 | 12/2020 | Ansell et al. |
| 10,892,190 | B2 | 1/2021 | Okita et al. |

(Continued)

FOREIGN PATENT DOCUMENTS

| | | |
|---|---|---|
| KR | 101117444 B1 | 3/2012 |
| KR | 102245976 B1 | 4/2021 |

*Primary Examiner* — Didarul A Mazumder
(74) *Attorney, Agent, or Firm* — Wolf, Greenfield & Sacks, P.C.

(57) ABSTRACT

A semiconductor package includes a first semiconductor chip including a first surface and an opposite second surface, second semiconductor chips vertically stacked on the first semiconductor chip, each of the second semiconductor chips including a third surface and an opposite fourth surface, and a molding layer on the first surface of the first semiconductor chip and at least partially surrounding the second semiconductor chips. The first surface of the first semiconductor chip is in direct contact with the fourth surface of a lowermost second semiconductor chip of the second semiconductor chips. The third surface of the lowermost second semiconductor chip of the second semiconductor chips is in direct contact with the fourth surface of an adjacent one of the second semiconductor chips. A width of each of the second semiconductor chips decreases in a direction from the third surface toward the fourth surface thereof.

17 Claims, 9 Drawing Sheets

10

170

(56) References Cited

U.S. PATENT DOCUMENTS

| | | | | |
|---|---|---|---|---|
| 11,335,564 | B2 | 5/2022 | Itou et al. | |
| 2019/0229091 | A1* | 7/2019 | Kim | H10W 90/00 |
| 2020/0098719 | A1* | 3/2020 | Park | H10W 74/012 |
| 2021/0057388 | A1* | 2/2021 | Oh | H10W 90/00 |
| 2021/0118734 | A1 | 4/2021 | Hong et al. | |
| 2021/0125955 | A1* | 4/2021 | Suh | H10W 90/00 |
| 2021/0202436 | A1 | 7/2021 | Yeh et al. | |
| 2021/0375709 | A1* | 12/2021 | Ko | H10W 74/117 |
| 2022/0223566 | A1* | 7/2022 | Lee | H10P 72/74 |
| 2022/0293565 | A1* | 9/2022 | Shin | H10W 90/00 |
| 2022/0344271 | A1* | 10/2022 | Nam | H10W 70/611 |

* cited by examiner

SEMICONDUCTOR PACKAGE AND A METHOD OF MANUFACTURING THE SAME

CROSS-REFERENCE TO RELATED APPLICATIONS

This U.S. non-provisional patent application claims priority under 35 U.S.C. § 119 to Korean Patent Application No. 10-2023-0031353, filed on Mar. 9, 2023, in the Korean Intellectual Property Office, the entire contents of which are hereby incorporated by reference.

BACKGROUND

The present disclosure relates to a semiconductor package and a method of manufacturing the same, and more particularly, to a semiconductor package including a plurality of stacked semiconductor chips and a method of manufacturing the same.

High-performance, high-speed and small electronic components have been in increasing demand with the development of the electronic industry. To satisfy these demands, a packaging technique of providing a plurality of semiconductor chips in a single package has been suggested.

Recently, portable devices have been in increasing demand in the electronics market, and thus small and light electronic components mounted in the electronics have been required. A semiconductor package technique of integrating a plurality of individual components in a single package as well as a technique of reducing a size of an individual component may be required to realize small and light electronic components. Here, a plurality of adhesive members may be used to adhere the plurality of components to each other, and various limitations may be caused by an increase in the number of the adhesive members.

SUMMARY

Embodiments of the inventive concepts may provide a semiconductor package with improved structural stability and a method of manufacturing the same.

Embodiments of the inventive concepts may also provide a semiconductor package with improved thermal stability and a method of manufacturing the same.

Embodiments of the inventive concepts may further provide a semiconductor package with improved reliability and a method of manufacturing the same.

In an aspect, a semiconductor package may include a first semiconductor chip including a first surface and an opposite second surface, second semiconductor chips vertically stacked on the first semiconductor chip, each of the second semiconductor chips including a third surface and an opposite fourth surface, and a molding layer on the first surface of the first semiconductor chip and at least partially surrounding the second semiconductor chips. The first surface of the first semiconductor chip may be in direct contact with the fourth surface of a lowermost second semiconductor chip of the second semiconductor chips. The third surface of the lowermost second semiconductor chip of the second semiconductor chips may be in direct contact with the fourth surface of an adjacent one of the second semiconductor chips. A width of each of the second semiconductor chips may decrease in a direction from the third surface toward the fourth surface thereof.

In an aspect, a semiconductor package may include a first semiconductor chip, a substrate connection terminal on a bottom surface of the first semiconductor chip, second semiconductor chips vertically stacked on the first semiconductor chip with each second semiconductor chip including inclined side surfaces, and a molding layer on a top surface of the first semiconductor chip and at least partially surrounding the second semiconductor chips. The side surface of each of the second semiconductor chips may include a plurality of concave portions. The plurality of concave portions may include a first concave portion and a second concave portion which are adjacent each other. A first distance from a side surface of the molding layer to the first concave portion may be greater than a second distance from the side surface of the molding layer to the second concave portion by a value of 0.1 µm to 10 µm.

In an aspect, a method of manufacturing a semiconductor package may include performing a plasma sawing process on a wafer to form second semiconductor chips, stacking the second semiconductor chips on a first semiconductor chip, and applying an insulating material on the first semiconductor chip to form a molding layer surrounding the second semiconductor chips. A side surface of each of the second semiconductor chips may include a plurality of concave portions. A first distance from a side surface of the molding layer to a first concave portion may be greater than a second distance from the side surface of the molding layer to a second concave portion adjacent the first concave portion by a value of 0.1 µm to 10 µm.

BRIEF DESCRIPTION OF THE DRAWINGS

FIG. 4 is a cross-sectional view illustrating a semiconductor package according to some embodiments of the inventive concepts.

DETAILED DESCRIPTION

Example embodiments of the inventive concepts will now be described more fully with reference to the accompanying drawings.

Figure 1:
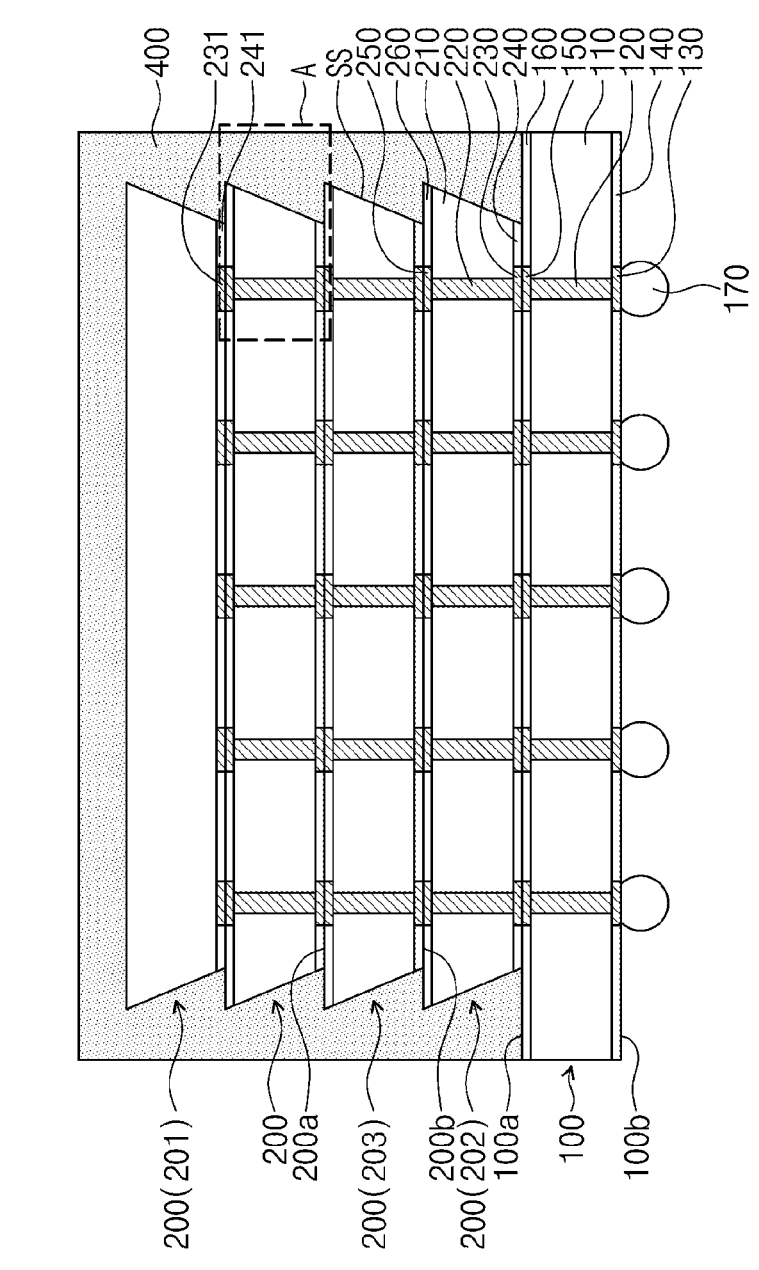
FIG. 1 is a cross-sectional view illustrating a semiconductor package according to some embodiments of the inventive concepts.
Figure 2:
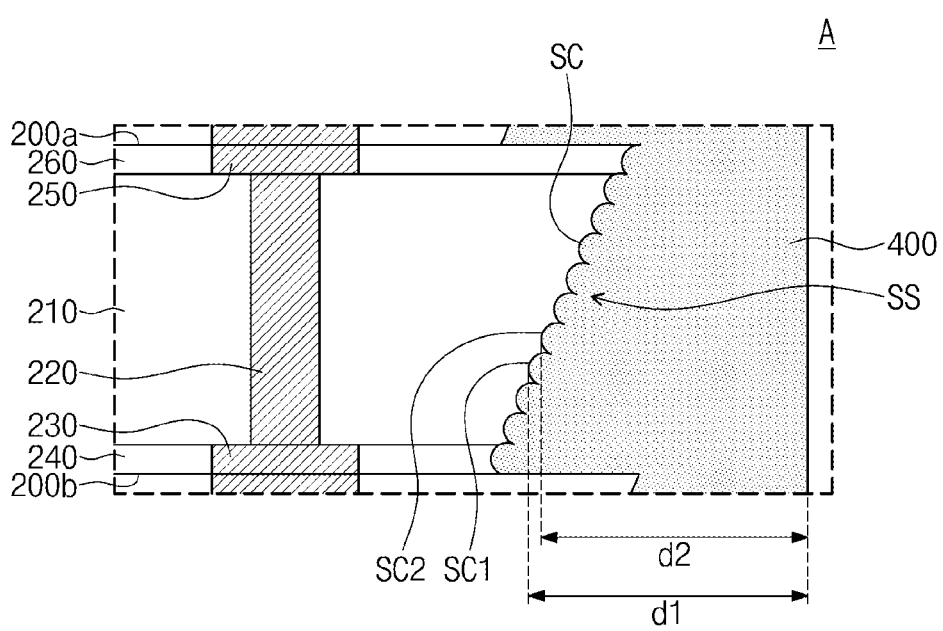
FIG. 2 is an enlarged view of a region 'A' of FIG. 1.

FIG. 1 is a cross-sectional view illustrating a semiconductor package according to some embodiments of the inventive concepts. FIG. 2 is an enlarged view of a region 'A' of FIG. 1.

Referring to FIGS. 1 and 2, a semiconductor package 10 may include a first semiconductor chip 100, second semiconductor chips 200, and a molding layer 400. The semiconductor package 10 may be a chip stack in which the semiconductor chips 100 and 200 are stacked.

The first semiconductor chip 100 may include a first semiconductor substrate 110, first through-electrodes 120, first chip pads 130, second chip pads 150, a first protective layer 140, and a second protective layer 160.

The first semiconductor chip 100 may include a first surface 100a and a second surface 100b which are opposite to each other. In FIG. 1, the first surface 100a of the first semiconductor chip 100 may be a top surface of the first semiconductor chip 100, and the second surface 100b may be a bottom surface of the first semiconductor chip 100. A side surface of the first semiconductor chip 100 may be perpendicular or substantially perpendicular to the first surface 100a of the first semiconductor chip 100. For example, the first semiconductor chip 100 may include a logic chip, a controller chip, or a buffer chip. Alternatively, the first semiconductor chip 100 may include a memory chip. In certain embodiments, the first semiconductor chip 100 may be a printed circuit board or a redistribution substrate.

The first semiconductor substrate 110 may be a semiconductor substrate including silicon, germanium or silicon-germanium, or a compound semiconductor substrate. For example, the first semiconductor substrate 110 may be a silicon substrate.

The first protective layer 140 may be provided on a bottom surface of the first semiconductor substrate 110. For example, the first protective layer 140 may be a circuit layer including an insulating layer, an interconnection pattern in the insulating layer, and an integrated device electrically connected to the interconnection pattern. In the present specification, it may be understood that when a component is referred to as being 'electrically connected' to another component, it may be directly connected to the other component or intervening components may be present. In certain embodiments, the circuit layer may be provided in the second protective layer 160 to be described below. For example, the insulating layer may include at least one of silicon oxide, silicon nitride, or silicon oxynitride. The interconnection pattern may include a conductive material such as copper.

The first chip pads 130 may be provided on the bottom surface of the first semiconductor substrate 110. The first chip pads 130 (or side surfaces thereof) may be surrounded by the first protective layer 140 on the bottom surface of the first semiconductor substrate 110. The first chip pads 130 may be exposed from a bottom surface of the first protective layer 140. In other words, the first chip pads 130 may be exposed from the second surface 100b of the first semiconductor chip 100. Bottom surfaces of the first chip pads 130 may be coplanar with the bottom surface of the first protective layer 140. The first chip pads 130 may include a conductive material such as copper, aluminum and/or nickel.

The first through-electrodes 120 may be provided in the first semiconductor substrate 110. Top surfaces and bottom surfaces of the first through-electrodes 120 may be exposed from the first semiconductor substrate 110. The first through-electrodes 120 may vertically penetrate or extend through the first semiconductor substrate 110 so as to be connected to the first chip pads 130. The first through-electrodes 120 may include a conductive material such as copper and/or tungsten.

The second chip pads 150 may be provided on a top surface of the first semiconductor substrate 110. Bottom surfaces of the second chip pads 150 may be in contact with the top surfaces of the first through-electrodes 120. The second chip pads 150 may be connected to the first through-electrodes 120. The second chip pads 150 may include a conductive material such as copper, aluminum and/or nickel.

The second protective layer 160 may be provided on the top surface of the first semiconductor substrate 110. The second protective layer 160 may surround the second chip pads 150 (or side surfaces thereof) on the top surface of the first semiconductor substrate 110. A top surface of the second protective layer 160 may expose top surfaces of the second chip pads 150. In other words, the second chip pads 150 may be exposed from the first surface 100a of the first semiconductor chip 100. The top surface of the second protective layer 160 may be coplanar with the top surfaces of the second chip pads 150. For example, the second protective layer 160 may include at least one of silicon oxide, silicon nitride, or silicon oxynitride.

Substrate connection terminals 170 may be provided on the bottom surface of the first semiconductor chip 100. The substrate connection terminals 170 may be provided on the bottom surfaces of the first chip pads 130. The substrate connection terminals 170 may include at least one of tin, silver, copper, nickel, bismuth, indium, antimony, or cerium.

The second semiconductor chips 200 may be provided on the first semiconductor chip 100. The second semiconductor chips 200 may be stacked on the first semiconductor chip 100 in a direction perpendicular to the first surface 100a of the first semiconductor chip 100. Four second semiconductor chips 200 may be stacked on the first semiconductor chip 100 as in FIG. 1, but embodiments of the inventive concepts are not limited thereto. The number of the second semiconductor chips 200 stacked on the first semiconductor chip 100 may be greater or lesser than four. A width of each of the second semiconductor chips 200 may be less than a width of the first semiconductor chip 100. A kind of the second semiconductor chips 200 may be different from a kind of the first semiconductor chip 100. For example, the second semiconductor chips 200 may be memory chips.

Hereinafter, components of one of the second semiconductor chips 200 will be described as a representative of the second semiconductor chips 200.

The second semiconductor chip 200 may include a second semiconductor substrate 210, second through-electrodes 220, third chip pads 230, fourth chip pads 250, a third protective layer 240, and a fourth protective layer 260.

The second semiconductor chip 200 may have a third surface 200a and a fourth surface 200b which are opposite to each other. In FIG. 1, the third surface 200a of the second semiconductor chip 200 may be a top surface of the second semiconductor chip 200, and the fourth surface 200b may be a bottom surface of the second semiconductor chip 200. A width of the second semiconductor chip 200 may become progressively less or smaller from the third surface 200a toward the fourth surface 200b. Thus, a width of the third surface 200a of the second semiconductor chip 200 may be greater than a width of the fourth surface 200b. The second semiconductor chip 200 may have an inclined side surface SS. The fourth surface 200b of the second semiconductor chip 200 may form an obtuse angle with the side surface SS of the second semiconductor chip 200, and the third surface 200a of the second semiconductor chip 200 may form an acute angle with the side surface SS of the second semiconductor chip 200. The second semiconductor chip 200 may have a trapezoid-shaped section.

The side surface SS of the second semiconductor chip 200 may have a surface roughness higher than those of the third surface 200a and the fourth surface 200b of the second semiconductor chip 200. The side surface SS of the second semiconductor chip 200 may have a scalloped shape. For example, a plurality of concave portions SC may be provided at the side surface SS of the second semiconductor chip 200. The concave portions SC may have shapes in which portions of the side surface SS of the second semiconductor chip 200 are recessed into the second semiconductor chip 200. The concave portions SC may be arranged along or extend along the side surface SS of the second semiconductor chip 200 and may be connected to each other. A first concave portion SC1 of the concave portions SC may be (horizontally) shifted from a second concave portion SC2 adjacent to the first concave portion SC1 by a distance of 0.1

μm to 10 μm (e.g., when viewed in a plan view). A width of the second semiconductor chip 200 at a first vertical level at which the first concave portion SC1 is located may be less than a width of the second semiconductor chip 200 at a second vertical level, at which the second concave portion SC2 is located, by a value of 0.1 μm to 20 μm.

A top surface of the second semiconductor substrate 210 may have a width greater than that of a bottom surface thereof. The second semiconductor substrate 210 may be a semiconductor substrate including silicon (Si), germanium (Ge) or silicon-germanium (SiGe), or a compound semiconductor substrate. For example, the second semiconductor substrate 210 may be a silicon substrate. A thickness of the semiconductor substrate of the second semiconductor substrate 210 may range from 1 μm to 100 μm.

The third protective layer 240 may be provided on a bottom surface of the second semiconductor substrate 210. For example, the third protective layer 240 may be a circuit layer including an insulating layer, an interconnection pattern in the insulating layer, and an integrated device electrically connected to the interconnection pattern. In certain embodiments, the circuit layer may be provided in the fourth protective layer 260 to be described below. For example, the insulating layer may include at least one of silicon oxide, silicon nitride, or silicon oxynitride. The interconnection pattern may include a conductive material such as copper.

The third chip pads 230 may be provided on the bottom surface of the second semiconductor substrate 210. The third chip pads 230 (or side surfaces thereof) may be surrounded by the third protective layer 240 on the bottom surface of the second semiconductor substrate 210. The third chip pads 230 may be exposed from a bottom surface of the third protective layer 240. In other words, the third chip pads 230 may be exposed from the fourth surface 200b of the second semiconductor chip 200. Bottom surfaces of the third chip pads 230 may be coplanar with the bottom surface of the third protective layer 240. The third chip pads 230 may include a conductive material such as copper, aluminum and/or nickel.

The second through-electrodes 220 may be provided in the second semiconductor substrate 210. Top surfaces and bottom surfaces of the second through-electrodes 220 may be exposed from the second semiconductor substrate 210. The second through-electrodes 220 may vertically penetrate or extend through the second semiconductor substrate 210 so as to be connected to the third chip pads 230. The second through-electrodes 220 may include a conductive material such as copper and/or tungsten.

The fourth chip pads 250 may be provided on a top surface of the second semiconductor substrate 210. Bottom surfaces of the fourth chip pads 250 may be in contact with the top surfaces of the second through-electrodes 220. The fourth chip pads 250 may be connected to the second through-electrodes 220. The fourth chip pads 250 may include a conductive material such as copper, aluminum and/or nickel.

The fourth protective layer 260 may be provided on the top surface of the second semiconductor substrate 210. The fourth protective layer 260 may surround the fourth chip pads 250 (or side surfaces thereof) on the top surface of the second semiconductor substrate 210. A top surface of the fourth protective layer 260 may expose top surfaces of the fourth chip pads 250. In other words, the fourth chip pads 250 may be exposed from the third surface 200a of the second semiconductor chip 200. The top surface of the fourth protective layer 260 may be coplanar with the top surfaces of the fourth chip pads 250. For example, the fourth protective layer 260 may include at least one of silicon oxide, silicon nitride, or silicon oxynitride.

The second semiconductor chips 200 may include an uppermost second semiconductor chip 201. The uppermost second semiconductor chip 201 may include a fifth protective layer 241 and fifth chip pads 231. The fifth protective layer 241 and the fifth chip pads 231 may be substantially the same as the third protective layer 240 and the third chip pads 230 described above, respectively.

The second semiconductor chips 200 may be mounted on the first semiconductor chip 100. More particularly, the fourth surface 200b of a second lower semiconductor chip 202, located at a lowermost level, of the second semiconductor chips 200 may be in direct contact with the first surface 100a of the first semiconductor chip 100. Here, the second chip pads 150 of the first semiconductor chip 100 may be bonded to the third chip pads 230 of the second lower semiconductor chip 202 by a metal-metal hybrid bonding method. The second chip pads 150 of the first semiconductor chip 100 and the third chip pads 230 of the second lower semiconductor chip 202 may be formed of the same metal and may be connected to each other to constitute a single body without an interface therebetween. In certain embodiments, chip connection terminals may be provided between the first semiconductor chip 100 and the second lower semiconductor chip 202 to connect the first semiconductor chip 100 and the second lower semiconductor chip 202.

The second semiconductor chips 200 may be electrically connected to each other. More particularly, a second intermediate semiconductor chip 203 may be mounted on the second lower semiconductor chip 202 provided thereunder. The fourth surface 200b of the second intermediate semiconductor chip 203 may be in direct contact with the third surface 200a of the second lower semiconductor chip 202. The fourth surface 200b of the second intermediate semiconductor chip 203 may be in contact with a portion of the third surface 200a of the second lower semiconductor chip 202 and may expose another portion of the third surface 200a of the second lower semiconductor chip 202. Here, the third chip pads 230 of the second intermediate semiconductor chip 203 may be bonded to the fourth chip pads 250 of the second lower semiconductor chip 202 by a metal-metal hybrid bonding method. The third chip pads 230 of the second intermediate semiconductor chip 203 and the fourth chip pads 250 of the second lower semiconductor chip 202 may be formed of the same metal and may be connected to each other to constitute a single body without an interface therebetween. In certain embodiments, chip connection terminals may be provided between the second intermediate semiconductor chip 203 and the second lower semiconductor chip 202 to connect the second intermediate semiconductor chip 203 and the second lower semiconductor chip 202. The side surface of the second intermediate semiconductor chip 203 and the side surface of the second lower semiconductor chip 202 may not be aligned with each other but may be horizontally offset from each other.

The connection relation between the second semiconductor chips 200 adjacent to each other was described using some second semiconductor chips 202 and 203 of the second semiconductor chips 200 as an example, but embodiments of the inventive concepts are not limited thereto. The connection relation between the second semiconductor chips 202 and 203 described above may be applied to other two adjacent ones of the second semiconductor chips 200.

In certain embodiments, the second semiconductor chips 200 adjacent to each other may be disposed in such a way that their third surfaces 200a are bonded to each other or may be disposed in such a way that their fourth surfaces 200b are bonded to each other.

The molding layer 400 may be provided on the first semiconductor chip 100. The molding layer 400 may at least partially cover or surround the second semiconductor chips 200 on the first surface 100a of the first semiconductor chip 100. The molding layer 400 may be in direct contact with the concave portions SC at the side surfaces of the second semiconductor chips 200. The molding layer 400 may be in contact with portions of the third surfaces 200a of the second semiconductor chips 200. The portion of the third surface 200a of the second semiconductor chip 200 may be a portion which is not in contact with the fourth surface 200b of another second semiconductor chip 200 adjacent thereto but is exposed. A side surface of the molding layer 400 may be vertically aligned or coplanar with the side surface of the first semiconductor chip 100. A distance d1 between the side surface of the molding layer 400 and the first concave portion SC1 may be greater than a distance d2 between the side surface of the molding layer 400 and the second concave portion SC2 by a value of 0.1 μm to 10 μm.

The distance between the side surface of the molding layer 400 and the concave portions SC was described using the first concave portion SC1 and the second concave portion SC2 adjacent to each other as an example, but the aforementioned distance relation between the side surface of the molding layer 400 and the first and second concave portions SC1 and SC2 may also be applied to other two adjacent ones of the concave portions SC. The molding layer 400 may include an insulating polymer such as an epoxy molding compound.

According to the embodiments of the inventive concepts, adhesive strength between the molding layer 400 and the side surfaces SS of the second semiconductor chips 200 may be improved due to the side surfaces SS of the second semiconductor chips 200, which have the plurality of concave portions SC. Thus, it is possible to prevent the side surfaces SS of the second semiconductor chips 200 from being delaminated from the molding layer 400 by heat. As a result, the semiconductor package with improved thermal stability and reliability may be provided.

Figure 3:
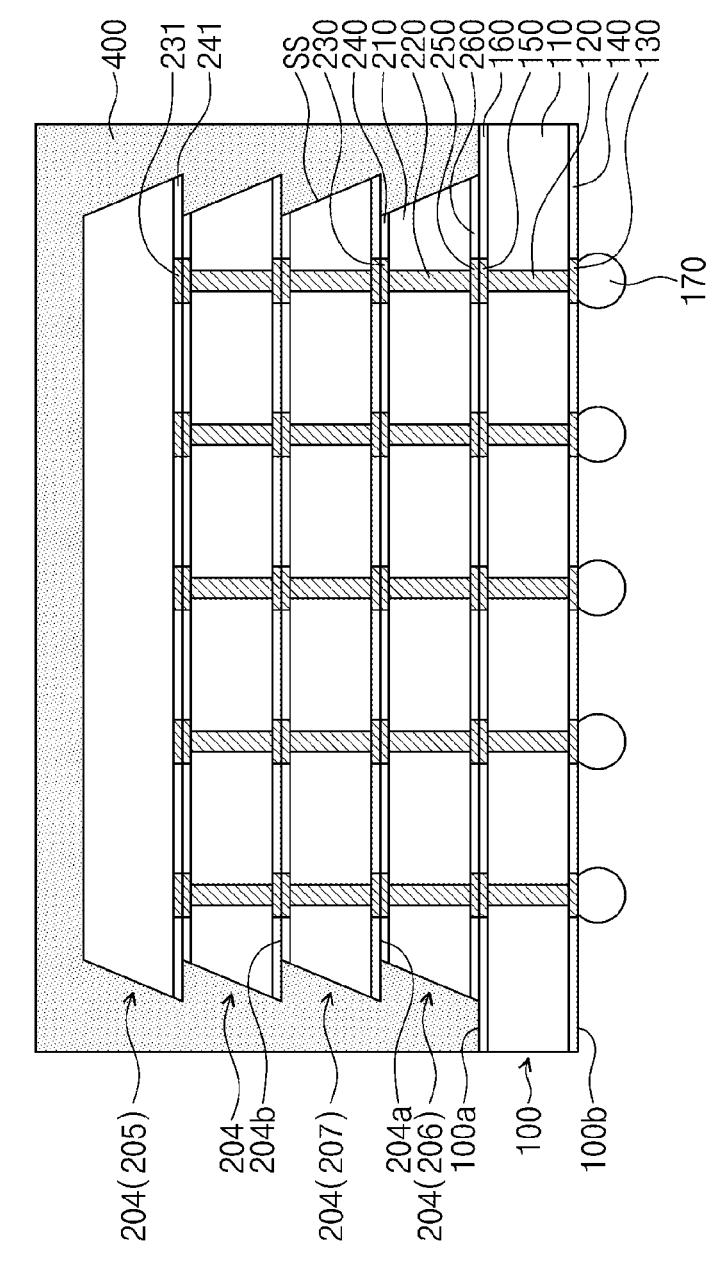
FIG. 3 is a cross-sectional view illustrating a semiconductor package according to some embodiments of the inventive concepts.

FIG. 3 is a cross-sectional view illustrating a semiconductor package according to some embodiments of the inventive concepts. Hereinafter, the descriptions to the same features as mentioned above may be omitted for the purpose of ease and convenience in explanation, and the same components will be indicated by the same reference numerals or designators.

Referring to FIG. 3, a semiconductor package 20 may include a first semiconductor chip 100, second semiconductor chips 204, and a molding layer 400.

The first semiconductor chip 100 may be substantially the same as described with reference to FIG. 1. Components of the second semiconductor chips 204 may be substantially the same as the components of the second semiconductor chips 200 described with reference to FIG. 1. However, each of the second semiconductor chips 204 may be each of the second semiconductor chips 200 of FIG. 1, which is turned over. Thus, unlike the embodiments of FIG. 1, a bottom surface of each of the second semiconductor chips 204 may be a third surface 204a, and a top surface of each of the second semiconductor chips 204 may be a fourth surface 204b. A width of each of the second semiconductor chips 204 may become progressively less or smaller from the third surface 204a toward the fourth surface 204b. In other words, the width of each of the second semiconductor chips 204 may become progressively less or smaller from its bottom surface toward its top surface.

The second semiconductor chips 204 may be mounted on the first semiconductor chip 100. More particularly, the third surface 204a of a second lower semiconductor chip 206, located at a lowermost level, of the second semiconductor chips 204 may be in direct contact with the first surface 100a of the first semiconductor chip 100. Here, the second chip pads 150 of the first semiconductor chip 100 may be bonded to the fourth chip pads 250 of the second lower semiconductor chip 206 by a metal-metal hybrid bonding method. The second chip pads 150 and the fourth chip pads 250 of the second lower semiconductor chip 206 may be formed of the same metal and may be connected to each other to constitute a single body without an interface therebetween. In certain embodiments, chip connection terminals may be provided between the first semiconductor chip 100 and the second lower semiconductor chip 206 to connect the first semiconductor chip 100 and the second lower semiconductor chip 206.

An uppermost second semiconductor chip 205 of the second semiconductor chips 204 may include substantially the same fifth chip pads 231 and fifth protective layer 241 as the uppermost second semiconductor chip 201 of FIG. 1, but the uppermost second semiconductor chip 205 may have a section shape different from that of the uppermost second semiconductor chip 201 of FIG. 1. A width of the uppermost second semiconductor chip 205 may become progressively greater from its top surface toward its bottom surface. Other components of the uppermost second semiconductor chip 205 may be substantially the same as corresponding components of the uppermost second semiconductor chip 201 of FIG. 1.

The second semiconductor chips 204 may be electrically connected to each other. More particularly, a second intermediate semiconductor chip 207 may be mounted on the second lower semiconductor chip 206 provided thereunder. The third surface 204a of the second intermediate semiconductor chip 207 may be in direct contact with the fourth surface 204b of the second lower semiconductor chip 206. The fourth surface 204b of the second lower semiconductor chip 206 may be in contact with a portion of the third surface 204a of the second intermediate semiconductor chip 207 and may expose another portion of the third surface 204a of the second intermediate semiconductor chip 207. Here, the fourth chip pads 250 of the second intermediate semiconductor chip 207 may be bonded to the third chip pads 230 of the second lower semiconductor chip 206 by a metal-metal hybrid bonding method. The fourth chip pads 250 of the second intermediate semiconductor chip 207 and the third chip pads 230 of the second lower semiconductor chip 206 may be formed of the same metal and may be connected to each other without an interface therebetween to constitute a single body. In certain embodiments, chip connection terminals may be provided between the second intermediate semiconductor chip 207 and the second lower semiconductor chip 206 to connect the second intermediate semiconductor chip 207 and the second lower semiconductor chip 206.

The connection relation between the second semiconductor chips 204 adjacent to each other was described using some second semiconductor chips 206 and 207 of the second semiconductor chips 204 as an example, but embodiments of the inventive concepts are not limited thereto. The aforementioned connection relation between the second semiconductor chips 206 and 207 may be applied to other two adjacent ones of the second semiconductor chips 204.

The molding layer 400 may be provided on the first semiconductor chip 100. The molding layer 400 may at least partially cover or surround the second semiconductor chips 204 on the first surface 100a of the first semiconductor chip 100. The molding layer 400 may be in contact with portions of the third surfaces 204a of the second semiconductor chips 204. The portion of the third surface 204a of the second semiconductor chip 204 may be a portion which is not in contact with the fourth surface 204b of another second semiconductor chip 204 adjacent thereto but is exposed. The molding layer 400 may include an insulating polymer such as an epoxy molding compound.

Figure 4:
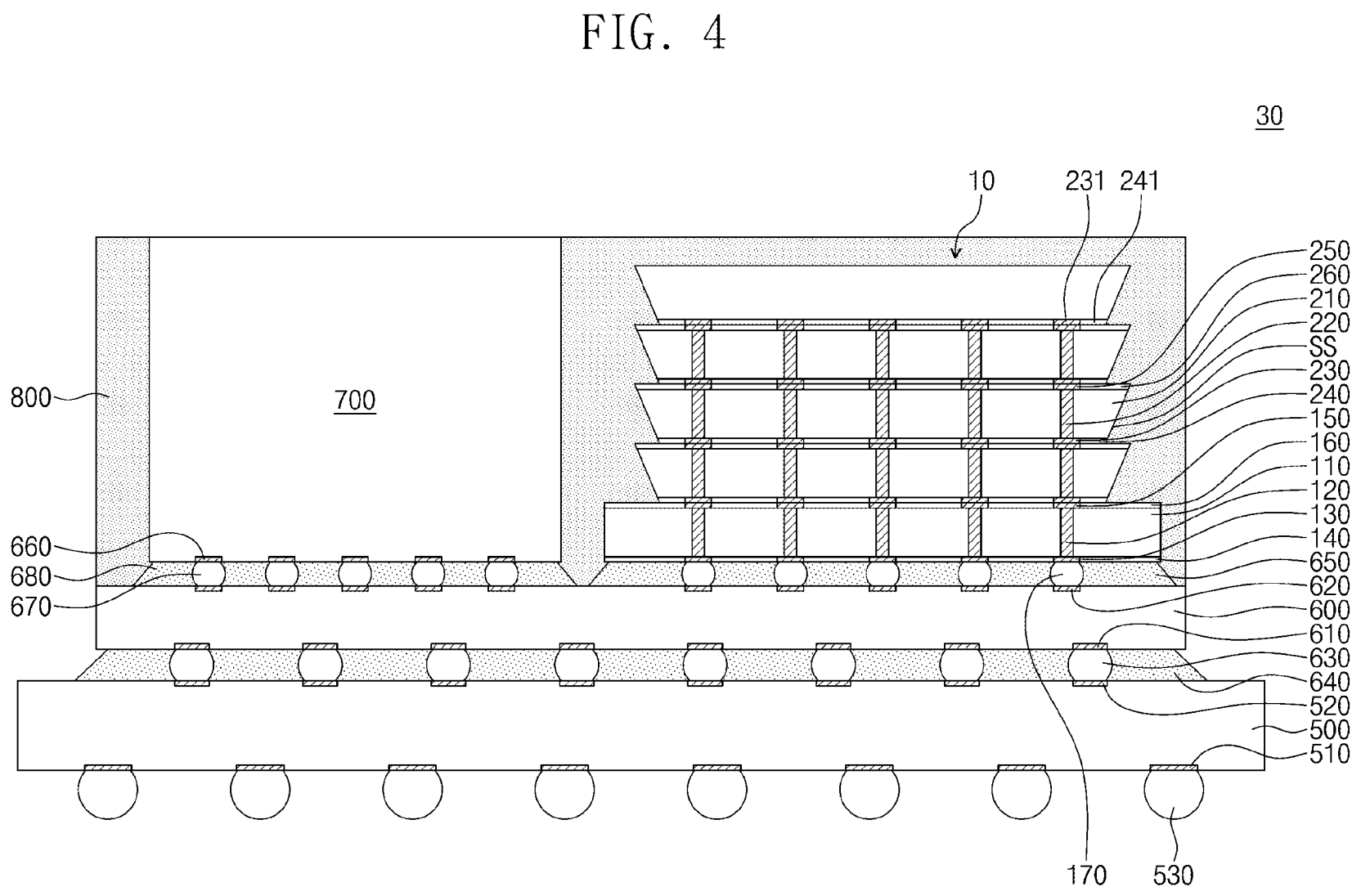

FIG. 4 is a cross-sectional view illustrating a semiconductor package according to some embodiments of the inventive concepts. Hereinafter, the descriptions to the same features as mentioned above may be omitted for the purpose of ease and convenience in explanation, and the same components will be indicated by the same reference numerals or designators.

Referring to FIG. 4, a semiconductor package 30 may include a package substrate 500, an interposer substrate 600, a third semiconductor chip 700, a chip stack 10, and a molding layer 800. The chip stack 10 may be substantially the same as the semiconductor package 10 shown in FIG. 1, but embodiments of the inventive concepts are not limited thereto. In certain embodiments, the chip stack may be the semiconductor package 20 shown in FIG. 3.

The package substrate 500 may be a printed circuit board including interconnection patterns printed on its top surface and bottom surface. Alternatively, the package substrate 500 may be a redistribution substrate including a plurality of stacked insulating layers and an interconnection layer in the insulating layers. First upper substrate pads 520 may be provided at a top surface of the package substrate 500. The first upper substrate pads 520 may be exposed from the top surface of the package substrate 500. First lower substrate pads 510 may be provided at a bottom surface of the package substrate 500. The first lower substrate pads 510 may be exposed from the bottom surface of the package substrate 500. The first upper substrate pads 520 and the first lower substrate pads 510 may be electrically connected to each other through interconnection lines in the package substrate 500. The first upper substrate pads 520 and the first lower substrate pads 510 may include a conductive material such as copper, aluminum and/or nickel.

External connection terminals 530 may be disposed on the bottom surface of the package substrate 500. The external connection terminals 530 may be disposed on the first lower substrate pads 510. The external connection terminals 530 may include solder balls or solder bumps. The external connection terminals 530 may include tin, silver, copper, nickel, bismuth, indium, antimony, cerium, or any alloy thereof. Depending on a kind of the external connection terminals 530, the semiconductor package 30 may be provided in a ball grid array (BGA) type, a fine ball-grid array (FBGA) type or a land grid array (LGA) type.

The interposer substrate 600 may be provided on the package substrate 500. Second upper substrate pads 620 may be disposed at a top surface of the interposer substrate 600. The second upper substrate pads 620 may be exposed from the top surface of the interposer substrate 600. Second lower substrate pads 610 may be disposed at a bottom surface of the interposer substrate 600. The second lower substrate pads 610 may be exposed from the bottom surface of the interposer substrate 600. The second upper substrate pads 620 and the second lower substrate pads 610 may be electrically connected to each other through interconnection lines provided in the interposer substrate 600. In certain embodiments, the second upper substrate pads 620 may be vertically aligned with the second lower substrate pads 610, and through-electrodes may be provided to connect the second upper substrate pads 620 to the second lower substrate pads 610.

The interposer substrate 600 may be mounted on the package substrate 500. For example, the interposer substrate 600 may be mounted on the package substrate 500 through interposer connection terminals 630 provided between the first upper substrate pads 520 and the second lower substrate pads 610. The interposer connection terminals 630 may include solder balls or solder bumps. The interposer connection terminals 630 may include tin, silver, copper, nickel, bismuth, indium, antimony, cerium, or any alloy thereof.

A first underfill 640 may be provided between the interposer substrate 600 and the package substrate 500. The first underfill 640 may at least partially surround the interposer connection terminals 630 and may fill or be in a space between the interposer connection terminals 630.

The third semiconductor chip 700 may be provided on the interposer substrate 600. The third semiconductor chip 700 may include a logic chip or a buffer chip. The logic chip may include an ASIC chip or an application processor (AP) chip. Alternatively, the logic chip may include a central processing unit (CPU) or a graphic processing unit (GPU). The ASIC chip may include an application specific integrated circuit (ASIC). In certain embodiments, the third semiconductor chip 700 may be a memory chip.

The third semiconductor chip 700 may include conductive pads 660 exposed at a bottom surface of the third semiconductor chip 700. The conductive pads 660 may be electrically connected to an integrated circuit in the third semiconductor chip 700. For example, the conductive pads 660 may include copper.

The third semiconductor chip 700 may be mounted on the interposer substrate 600 by a flip chip method. For example, the third semiconductor chip 700 may be mounted on the interposer substrate 600 through chip connection terminals 670 provided between the conductive pads 660 and the second upper substrate pads 620. The chip connection terminals 670 may be connected to the conductive pads 660 and some of the second upper substrate pads 620. The chip connection terminals 670 may include solder balls or solder bumps. The chip connection terminals 670 may include tin, silver, copper, nickel, bismuth, indium, antimony, cerium, or any alloy thereof.

A second underfill 680 may be provided between the third semiconductor chip 700 and the interposer substrate 600. The second underfill 680 may at least partially surround the chip connection terminals 670 and may fill or be in a space between the chip connection terminals 670.

The chip stack 10 may be provided on the interposer substrate 600. The chip stack 10 may be laterally or horizontally spaced apart from the third semiconductor chip 700 on the interposer substrate 600. The chip stack 10 may be mounted on the interposer substrate 600 through the substrate connection terminals 170. The chip stack 10 may be disposed on the interposer substrate 600 in such a way that the substrate connection terminals 170 are aligned with corresponding ones of the second upper substrate pads 620. The substrate connection terminals 170 may be connected to the corresponding ones of the second upper substrate pads 620. The chip stack 10 and the third semiconductor chip 700 may be electrically connected to each other through the interposer substrate 600.

A third underfill 650 may be provided between the chip stack 10 and the interposer substrate 600. The third underfill 650 may fill or be in a space between the chip stack 10 and the interposer substrate 600 and may at least partially surround the substrate connection terminals 170.

The molding layer 800 may be provided on the interposer substrate 600. The molding layer 800 may at least partially cover the top surface of the interposer substrate 600 and may at least partially surround the third semiconductor chip 700 and the chip stack 10. The molding layer 800 may include an insulating polymer such as an epoxy molding compound.

Figure 7:
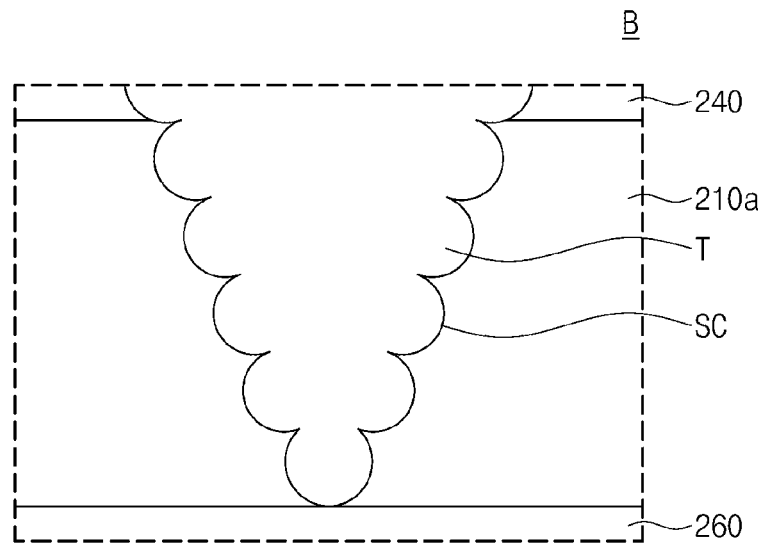
Figure 8:
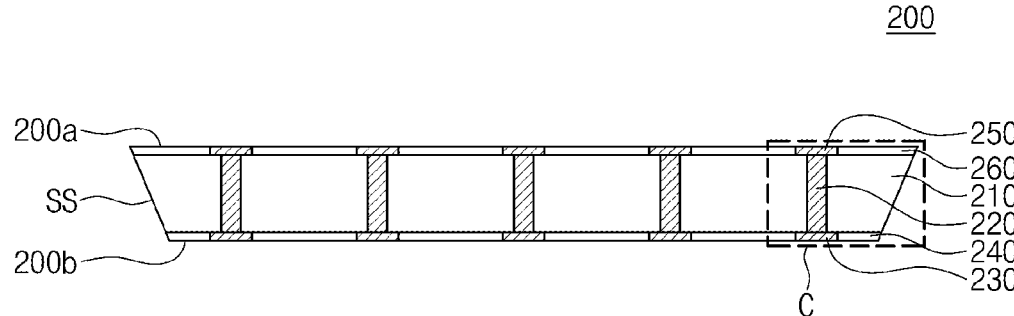
Figure 9:
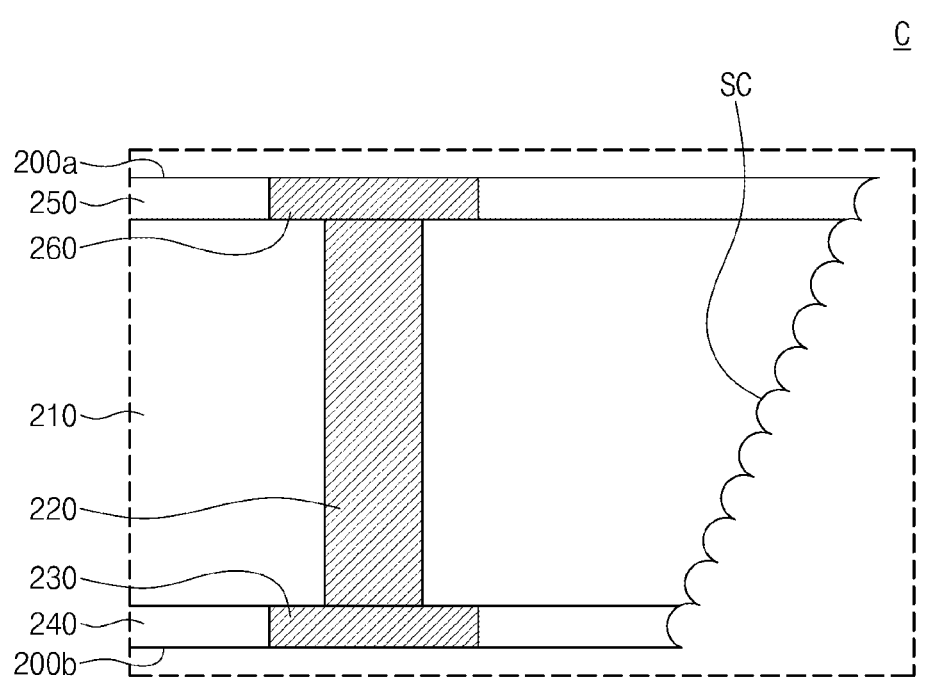

FIGS. 5 to 9 are cross-sectional views illustrating a method of manufacturing a semiconductor chip according to some embodiments of the inventive concepts. FIG. 7 is an enlarged view of a region 'B' of FIG. 6. FIG. 9 is an enlarged view of a region 'C' of FIG. 8.

Figures 5, 6:
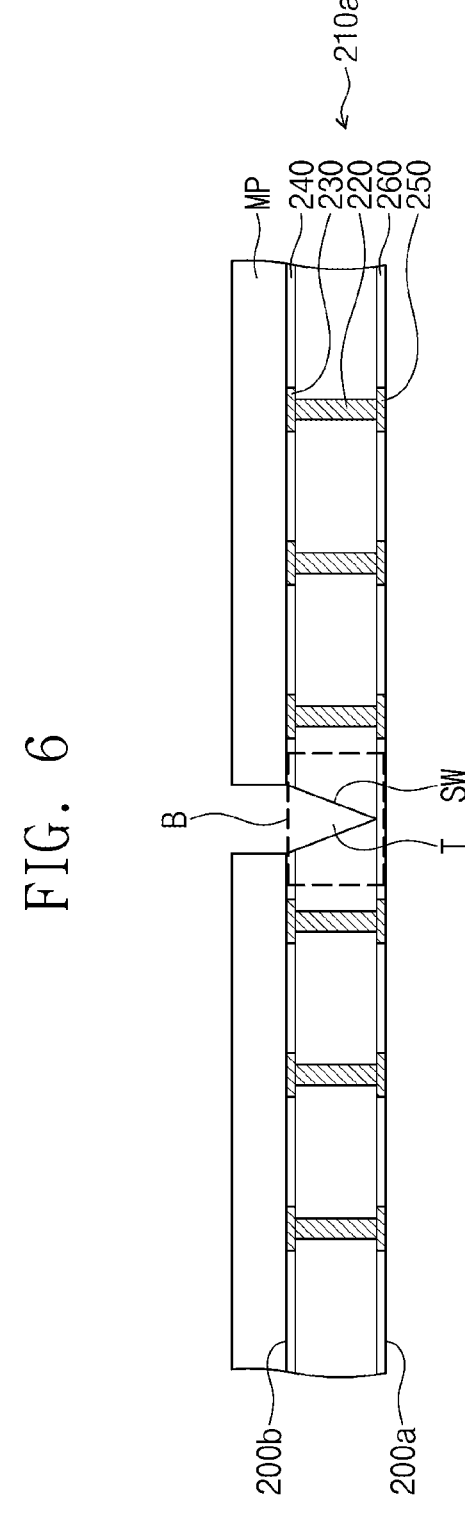
FIGS. 5 to 12 are cross-sectional views illustrating a method of manufacturing a semiconductor package according to some embodiments of the inventive concepts.

Referring to FIG. 5, a wafer 210a for manufacturing second semiconductor chips may be provided. The wafer 210a may include substantially the same second through-electrodes 220, third chip pads 230, fourth chip pads 250, third protective layer 240 and fourth protective layer 260 as the second semiconductor chips 200 described with reference to FIG. 1. However, the wafer 210a may have an area greater than that of each of the second semiconductor chips 200 to manufacture a plurality of the second semiconductor chips 200.

A mask pattern MP may be formed on a fourth surface 200b of the wafer 210a. The mask pattern MP may cover a portion of the fourth surface 200b of the wafer 210a and may expose another portion of the fourth surface 200b of the wafer 210a. The mask pattern MP may expose a region of the wafer 210a, on which a cutting process will be performed.

Referring to FIGS. 6 to 9, a cutting process may be performed on the exposed fourth surface 200b of the wafer 210a. For example, the cutting process may be a process of cutting the wafer 210a by a plasma sawing process. A portion of the wafer 210a may be etched using plasma, and thus a trench T having an inclined sidewall SW may be formed in the wafer 210a. The trench T may have a V-shaped section. The sidewall SW may have a surface roughness greater than those of the third surface 200a and the fourth surface 200b of the wafer 210a. The sidewall SW may have a scalloped shape including a plurality of concave portions SC.

The wafer 210a may be completely cut by the plasma sawing process to manufacture the second semiconductor chip 200. After the wafer 210a is completely cut, the mask pattern MP may be removed from the fourth surface 200b of the second semiconductor chip 200. The second semiconductor chip 200 may have an inclined side surface SS. The side surface SS of the second semiconductor chip 200 may have a scalloped shape including a plurality of the concave portions SC.

According to the embodiments of the inventive concepts, the second semiconductor chips 200 may be manufactured using the plasma sawing process. A size of a silicon particle generated in the plasma sawing process may be less than a size of a silicon particle generated in a blade sawing process. Thus, when the second semiconductor chips 200 manufactured using the plasma sawing process are bonded to each other, it is possible to prevent a void from being formed at a bonded surface of the second semiconductor chips 200 by silicon particles, and a yield and reliability may be improved in the process of manufacturing a semiconductor package.

Figure 10:
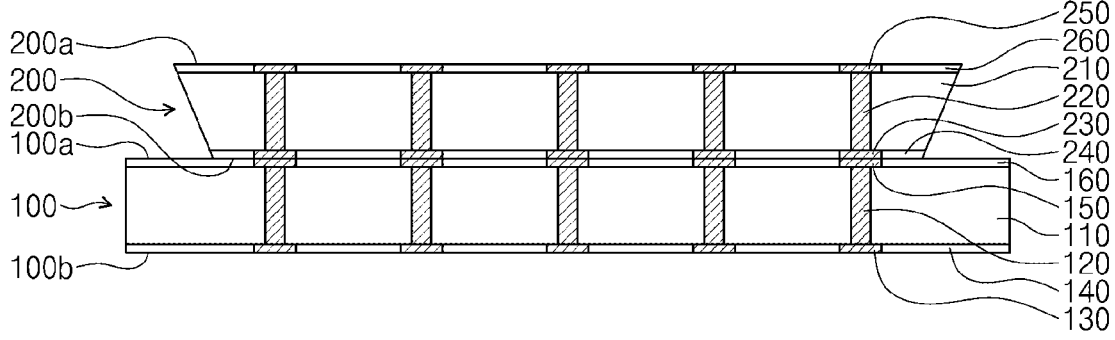
Figure 11:
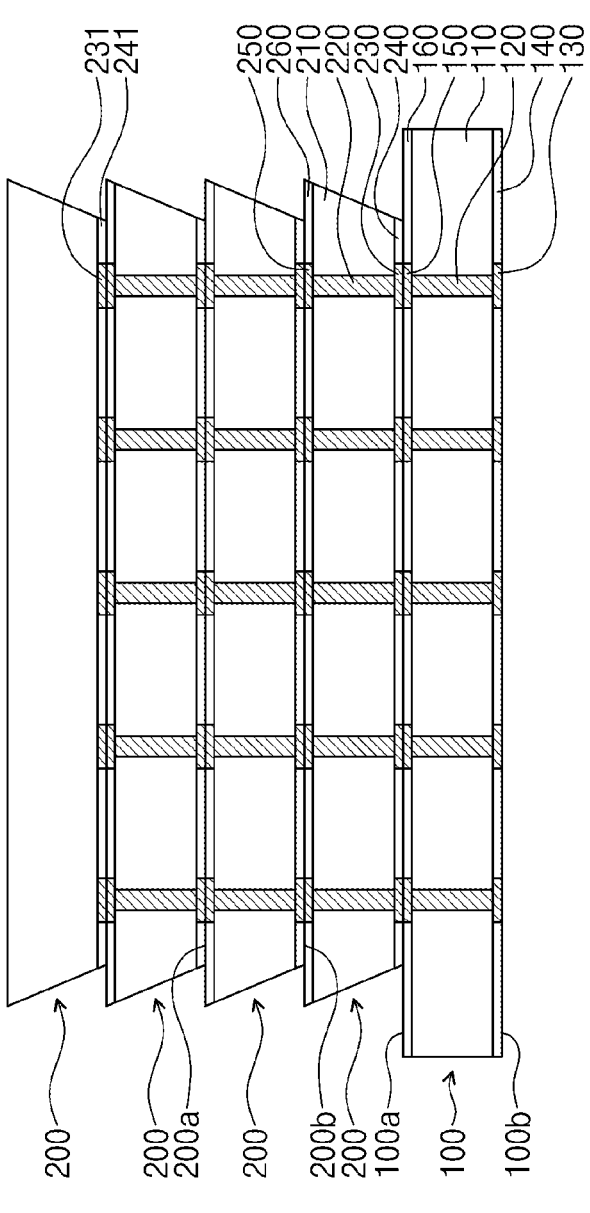
Figure 12:
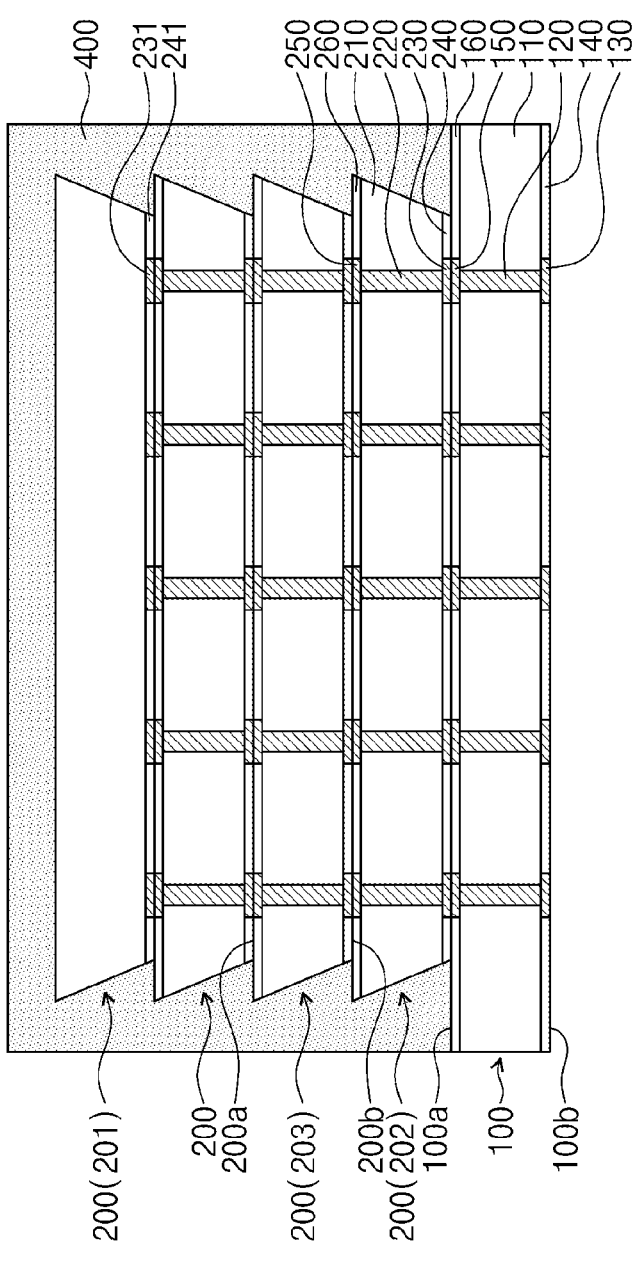

FIGS. 10 to 12 are cross-sectional views illustrating a method of manufacturing a semiconductor package according to some embodiments of the inventive concepts.

Referring to FIG. 10, the second semiconductor chip 200 formed using the manufacturing method of FIGS. 5 to 9 may be provided on a first semiconductor chip 100. The second semiconductor chip 200 may be bonded to the first semiconductor chip 100. More particularly, the second semiconductor chip 200 may be disposed on the first semiconductor chip 100 in such a way that the second chip pads 150 of the first semiconductor chip 100 are vertically aligned with the third chip pads 230 of the second semiconductor chip 200. Thereafter, the second chip pads 150 and the third chip pads 230, which include the same kind of metals, may be bonded to each other by a thermal treatment process to constitute a single body.

Referring to FIG. 11, another second semiconductor chip 200 may be provided on the second semiconductor chip 200, and then, adjacent chip pads 230 and 250 may be bonded to each other by the aforementioned bonding method using the same kind of metals. The processes of stacking another second semiconductor chip 200 on the second semiconductor chip 200 and then bonding adjacent chip pads may be repeated to manufacture a chip stack.

Referring to FIG. 12, an insulating material may be applied onto the first surface 100a of the first semiconductor chip 100 to form a molding layer 400. The insulating material may at least partially cover or surround the second semiconductor chips 200 on the first surface 100a of the first semiconductor chip 100. The insulating material may cover the plurality of concave portions of the side surfaces of the second semiconductor chips 200. For example, the insulating material may include an insulating polymer such as an epoxy molding compound.

Referring again to FIG. 1, substrate connection terminals 170 may be provided on the second surface 100b of the first semiconductor chip 100. The substrate connection terminals 170 may be provided on the first chip pads 130 exposed from the second surface 100b of the first semiconductor chip 100. Thus, the semiconductor package 10 may be manufactured.

The semiconductor package according to the embodiments of the inventive concepts may include the semiconductor chips having the side surfaces at which the concave portions are formed. The concave portions may be in direct contact with the molding layer surrounding the semiconductor chips and may prevent the molding layer from being delaminated from the semiconductor chips by heat. Thus, the structural and thermal stability of the semiconductor package may be improved.

In addition, the semiconductor chips may be manufactured using the plasma sawing process to reduce the sizes of the silicon particles generated in the cutting process for forming the semiconductor chip, and thus the semiconductor chips may be easily bonded to each other. As a result, it is possible to provide the method of manufacturing a semiconductor package, which is capable of improving productivity and reliability.

While embodiments of the inventive concepts have been particularly shown and described, it will be understood by one of ordinary skill in the art that variations in form and detail may be made therein without departing from the scope of the attached claims.

What is claimed is:

1. A semiconductor package comprising:
a first semiconductor chip including a first surface and an opposite second surface;

second semiconductor chips vertically stacked on the first semiconductor chip, each of the second semiconductor chips including a third surface and an opposite fourth surface; and a molding layer on the first surface of the first semiconductor chip and at least partially surrounding the second semiconductor chips, wherein the first surface of the first semiconductor chip is in direct contact with the fourth surface of a lowermost second semiconductor chip of the second semiconductor chips, wherein the third surface of the lowermost second semiconductor chip of the second semiconductor chips is in direct contact with the fourth surface of an adjacent one of the second semiconductor chips, and wherein a width of each of the second semiconductor chips decreases in a direction from the third surface toward the fourth surface thereof.

2. The semiconductor package of claim 1, wherein each of the second semiconductor chips includes an inclined side surface, and wherein each of the second semiconductor chips includes a plurality of concave portions at the side surface.

3. The semiconductor package of claim 2, wherein the plurality of concave portions includes a first concave portion and a second concave portion which are adjacent each other, and wherein a first distance from a side surface of the molding layer to the first concave portion is greater than a second distance from the side surface of the molding layer to the second concave portion by a value of 0.1 µm to 10 µm.

4. The semiconductor package of claim 2, wherein the molding layer is in direct contact with portions of the third surfaces of the second semiconductor chips and the plurality of concave portions of the side surface.

5. The semiconductor package of claim 3, wherein a first width of the second semiconductor chip at a first vertical level, at which the first concave portion is located, is less than a second width of the second semiconductor chip at a second vertical level, at which the second concave portion is located, by a value of 0.1 µm to 20 µm.

6. The semiconductor package of claim 1, wherein the fourth surface of each of the second semiconductor chips forms an obtuse angle with a side surface thereof, and wherein the third surface of each of the second semiconductor chips forms an acute angle with the side surface thereof.

7. The semiconductor package of claim 1, wherein the fourth surface of the adjacent one of the second semiconductor chips is in direct contact with the third surface of still another adjacent one of the second semiconductor chips.

8. The semiconductor package of claim 1, wherein the first semiconductor chip has a width greater than that of each of the second semiconductor chips, and wherein a side surface of the first semiconductor chip is substantially perpendicular to the first surface of the first semiconductor chip.

9. The semiconductor package of claim 1, wherein at least one of the second semiconductor chips comprises: protective layers on the third surface and the fourth surface of the at least one of the second semiconductor chips; and a semiconductor substrate between the protective layers, and wherein a thickness of the semiconductor substrate ranges from 1 µm to 100 µm.

10. A semiconductor package comprising:

a first semiconductor chip;

a substrate connection terminal on a bottom surface of the first semiconductor chip;

second semiconductor chips vertically stacked on the first semiconductor chip with each second semiconductor chip including inclined side surfaces; and a molding layer on a top surface of the first semiconductor chip and at least partially surrounding the second semiconductor chips, wherein the side surface of each of the second semiconductor chips includes a plurality of concave portions, wherein the plurality of concave portions includes a first concave portion and a second concave portion which are adjacent each other, and wherein a first distance from a side surface of the molding layer to the first concave portion is greater than a second distance from the side surface of the molding layer to the second concave portion by a value of 0.1 µm to 10 µm.

11. The semiconductor package of claim 10, wherein a width of each of the second semiconductor chips decreases from its top surface toward its bottom surface.

12. The semiconductor package of claim 10, wherein a width of each of the second semiconductor chips decreases from its bottom surface toward its top surface.

13. The semiconductor package of claim 10, wherein a first chip pad on the top surface of the first semiconductor chip is in direct contact with a second chip pad on a bottom surface of a lowermost second semiconductor chip of the second semiconductor chips to define a single body, and wherein a third chip pad on a top surface of the lowermost second semiconductor chip of the second semiconductor chips is in direct contact with a fourth chip pad on a bottom surface of an adjacent second semiconductor chip of the second semiconductor chips to define a single body.

14. The semiconductor package of claim 10, wherein at least one of the second semiconductor chips comprises: protective layers on its top surface and bottom surface; and a semiconductor substrate between the protective layers, and wherein a thickness of the semiconductor substrate ranges from 1 µm to 100 µm.

15. The semiconductor package of claim 10, wherein a bottom surface of an adjacent second semiconductor chip of the second semiconductor chips is in contact with only a portion of a top surface of the lowermost second semiconductor chip of the second semiconductor chips and exposes another portion of the top surface of the lowermost second semiconductor chip.

16. The semiconductor package of claim 10, wherein the molding layer is in contact with portions of top surfaces of the second semiconductor chips and the side surfaces of the second semiconductor chips.

17. The semiconductor package of claim 10, further comprising:

a substrate on which the first semiconductor chip is mounted;

a third semiconductor chip on the substrate and laterally spaced apart from the second semiconductor chips; and an external connection terminal on a bottom surface of the substrate.

* * * * *